(12) United States Patent
Nakayama

(10) Patent No.: US 8,319,240 B2
(45) Date of Patent: Nov. 27, 2012

(54) LIGHT-EMITTING DEVICE

(75) Inventor: Katsuyoshi Nakayama, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 150 days.

(21) Appl. No.: 12/956,539

(22) Filed: Nov. 30, 2010

(65) Prior Publication Data

US 2011/0220939 A1 Sep. 15, 2011

(30) Foreign Application Priority Data

Mar. 12, 2010 (JP) ................................. 2010-056231
Oct. 14, 2010 (JP) ................................. 2010-231623

(51) Int. Cl.
*H01L 33/00* (2010.01)
*H01L 21/00* (2006.01)
(52) U.S. Cl. .......................................... 257/98; 438/29
(58) Field of Classification Search ............... 438/25–32, 438/47, 956; 257/95–99
See application file for complete search history.

(56) References Cited

U.S. PATENT DOCUMENTS

| 4,007,396 | A | 2/1977 | Wisbey et al. |
| 7,641,357 | B2 * | 1/2010 | Tanamura et al. ............ 362/183 |
| 7,888,869 | B2 * | 2/2011 | Tanda et al. .................... 313/512 |
| 2007/0057364 | A1 | 3/2007 | Wang et al. |
| 2008/0043444 | A1 | 2/2008 | Hasegawa et al. |
| 2009/0010017 | A1 | 1/2009 | Hayashi et al. |
| 2009/0315057 | A1 | 12/2009 | Konishi et al. |

FOREIGN PATENT DOCUMENTS

| EP | 1 605 524 A1 | 12/2005 |
| EP | 2 053 667 A2 | 4/2009 |
| EP | 2 053 667 A3 | 4/2009 |
| JP | 2004-111937 | 4/2004 |
| JP | 2006-41230 | 2/2006 |
| JP | 2007-129053 | 5/2007 |

(Continued)

OTHER PUBLICATIONS

U.S. Appl. No. 13/448,709, filed Apr. 17, 2012, Nakayama.
U.S. Appl. No. 12/955,941, filed Nov. 29, 2010, Nakayama.
U.S. Appl. No. 12/955,338, filed Nov. 29, 2010, Nakayama.

*Primary Examiner* — Calvin Lee
(74) *Attorney, Agent, or Firm* — Oblon, Spivak, McClelland, Maier & Neustadt, L.L.P.

(57) ABSTRACT

To provide a light-emitting device mounting a light-emitting element having a metal film on the rear side surface, which is excellent in light extraction efficiency since it has high heat dissipating properties and high light reflection efficiency, and which can suppress the reduction of light extraction efficiency due to the deterioration with time.

A light-emitting device which comprises:
  a substrate made of an inorganic insulating material,
  a metal conductor layer formed on the mounting portion of the substrate,
  a conductive protective layer formed on the above metal conductor layer,
  a light-emitting element having a metal film on the rear side surface, and mounted on the mounting portion of the above substrate so that the metal film faces the conductive protective layer and is located inside the edge of the conductive protective layer,
  an electroconductive bonding material to bond the light-emitting element with the conductive protective layer,
  a reflection film formed on the mounting surface of the above substrate in such a shape as to exclude the conductive protective layer and the vicinity around it, and
  an insulating protective layer formed on the mounting surface of the substrate so as to cover the entirety of the above reflection film including its edge.

12 Claims, 2 Drawing Sheets

FOREIGN PATENT DOCUMENTS

| | | |
|---|---|---|
| JP | 2007-129191 | 5/2007 |
| JP | 2008-10591 | 1/2008 |
| JP | 2009-231440 | 10/2009 |
| JP | 2009-231510 | 10/2009 |
| JP | 2010-34487 | 12/2010 |
| WO | WO 2008/098832 A1 | 8/2008 |

* cited by examiner

LIGHT-EMITTING DEVICE

TECHNICAL FIELD

The present invention relates to a light-emitting device. More particularly, it relates to a light-emitting device mounting a high-output light-emitting element, and having high brightness and less deterioration of light intensity.

BACKGROUND ART

In recent years, along with a tendency to high brightness and whitening of a light-emitting diode (LED) element, a light-emitting device employing a LED element has been used for backlights of mobile phones, liquid crystal TVs, liquid crystal displays, etc.

However, in such a light-emitting device, there has been a problem such that along with a tendency to high brightness of a LED element, heat generation is also increasing, and the temperature increases excessively, whereby adequate emission brightness has not necessarily been obtained. Further, in order to obtain a high light extraction efficiency, a technology has been proposed to dispose a silver reflection film on e.g. a substrate surface to mount a LED element, but in such a light-emitting device, there has been a problem of so-called light intensity deterioration such that the light extraction efficiency deteriorates as compared with the initial stage since a silver reflection film is deteriorated by oxidation or sulfurization due to heat or permeated gas. Accordingly, as a light-emitting device employing a light-emitting element such as a light-emitting diode element, one having high heat dissipation property and light reflection efficiency, and further having less deterioration in light intensity in long-term use has been desired.

In order to solve these problems, e.g. Patent Document 1 discloses a technology relating to a light-emitting device having a structure which can suppress occurrence of delamination between a molded member forming a sealing layer and a substrate made of a ceramic material with a high heat dissipation property, such as alumina, aluminum nitride or mulite, and further having a construction in which a high-melting point metal film having a high adhesion with a substrate and a metal film having a high reflectivity are used in combination as a reflection film to improve adhesion to a substrate and reflectivity of a metal reflection film. Further, Patent document 2 discloses a technology of employing a sealing resin having a low gas permeability, as a sealing resin to seal a semiconductor light-emitting element, an electrical conductor electrically connected therewith or a reflection film constructed on a substrate. Further, in a light-emitting device employing a low temperature co-fired ceramic substrate (hereinafter referred to as LTCC) having a high heat dissipation property, a silver reflection film disposed on a substrate is covered with an overcoat glass film, for the purpose of preventing deterioration of light intensity.

Here, a LED element having a relatively low output, which has been commonly used, has a structure in which light is emitted not only from a light extraction side but also from a surface (rear surface of a LED element) mounted on a substrate of a light-emitting device, toward the substrate. Therefore, in order to reflect this light to the light extraction side, the mounting surface of the substrate is made of a high-reflectance material, and further a silicone-type die bond material having a high light transmittance is employed as a die bond material to bond the LED element with the substrate.

For example, Patent Document 3 discloses a technology relating to a LED light-emitting device, in which a substrate material having a high thermal conductivity and less change in reflection efficiency, specifically one having an aluminum plate subjected to alumite treatment or one having a copper plate subjected to aluminizing treatment, is used for a substrate, and to such a substrate, a LED chip is die-bonded by a transparent paste (silicone die bond material). Further, in such a light-emitting device using a conventional LED element, in consideration of the heat dissipation property, an electroconductive die bond material made of a thermosetting resin containing e.g. silver particles is preferred as a die bond material, but the electroconductive die bond material is not usually used since the light extraction efficiency tends to deteriorate due to low reflectance of the electroconductive die bond material.

On the other hand, a recently used LED element having a high output exceeding 0.5 W and a large heat generation, has a structure in which a metal layer is formed on a rear surface (surface to be mounted on a substrate) as an opposite side of a light extraction side having a light emitting layer formed thereon. Since a material (such as aluminum) having not only a high thermal conductivity but also a high reflectance is used for the metal layer, it also functions as a reflection film, and light emitted from a light emitting layer of an upper layer hits on the metal layer (reflection film) on a rear surface and reflected upward. Accordingly, it is not necessary to dispose a material having a high reflectance, on a substrate just under the mounting portion of the LED element. Further, light never passes through the rear surface due to the reflection film, and therefore it is possible to use an electroconductive bonding material for bonding to a substrate, in consideration of the heat dissipation property.

However, although such a LED element having a metal reflection film on a rear surface opposite to a light extraction side is bonded on a substrate by using a electroconductive die-bond material, except for this aspect, the LED element has been used for a light-emitting device having the same construction as the conventional light-emitting device, such that the LED element is mounted e.g. on the above conventional substrate for mounting light-emitting element having the same construction as a LED element having no metal reflection film, specifically, on a substrate of ceramics having a high thermal conductivity such as alumina or aluminum nitride, or on an overcoat glass film covering a silver reflection film formed on a LTCC substrate. Accordingly, the light extraction efficiency is insufficient, and it is impossible to obtain light having high brightness corresponding to high output of the light-emitting element.

Accordingly, in a light-emitting device mounting a light-emitting element such as a LED element having a metal reflection film on a surface (a rear surface of the LED element) as an opposite side of a light extraction side, it has been desired to develop a light-emitting device having a structure which has a high heat dissipation property and high light reflection efficiency thereby to obtain an excellent light extraction efficiency and suppresses deterioration of light extraction efficiency due to deterioration with time.

PRIOR ART DOCUMENT

Patent Document

Patent Document 1: JP-A-2004-111937
Patent Document 2: JP-A-2009-231510
Patent Document 3: JP-A-2007-129053

DISCLOSURE OF THE INVENTION

Problems to be Solved by the Invention

The present invention has been made to solve such problems and has an object to provide a light-emitting device mounting a light-emitting element having a reflective metal film on the surface as an opposite side of a light emitting layer, which is excellent in light extraction efficiency since it has high heat dissipation property and high light reflection efficiency, and which can suppress the deterioration of light extraction efficiency due to the deterioration with time.

Means to Solve the Problems

The light-emitting device of the present invention comprises:
a substrate made of an inorganic insulating material and having a mounting surface a part which constitutes a mounting portion on which a light-emitting element is to be mounted,
a metal conductor layer formed on the mounting portion of the above substrate,
a first electroconductive protective layer formed on the above metal conductor layer so as to cover the entirety including its edge and to have an area larger than a metal film of the following light-emitting element,
the light-emitting element having a light emitting layer on the main surface and a reflective metal film on the surface on the side opposite to the main surface, and mounted on the mounting portion of the above substrate so that the metal film faces the first electroconductive protective layer and is located inside the edge of the first electroconductive protective layer,
an electroconductive bonding material to bond the above metal film of the above light-emitting element with the above first electroconductive protective layer,
a reflection film formed on the mounting surface of the above substrate in such a shape as to exclude at least the first electroconductive protective layer formed on the above metal conductive layer and the vicinity around it, and
an insulating protective layer formed on the mounting surface of the above substrate so as to cover the entirety of the above reflection film including its edge.

In the light-emitting device of the present invention, it is preferred that the above substrate is made of a sintered product of a glass ceramics composition comprising a glass powder and a ceramics filler. Further, it is preferred that the light-emitting device of the present invention has a thermal via which is disposed just under the above mounting portion to extend from the above mounting surface of the substrate to a non-mounting surface as a surface opposite to the mounting surface, so as to be embedded in the above substrate. In the light-emitting device of the present invention, it is preferred that the first electroconductive protective layer has a non-mounting region having a width of from 70 to 200 μm around a region where the above light-emitting element is bonded.

In the light-emitting device of the present invention, a light-emitting element has a pair of electrodes, and is electrically connected to an electrode conductor disposed on a substrate. Specifically, it is preferred that the light-emitting device of the present invention has a wiring conductor formed on the mounting surface of the above substrate, and has such a structure that the wiring conductor and the above light-emitting element are electrically connected by a bonding wire. In such a case, it is preferred that the above reflection film is formed on the above mounting surface of the above substrate so as to exclude the first electroconductive protective layer formed on the above metal conductive layer and the vicinity around it, and the above wiring conductor and the vicinity around it, and further, it is preferred that the light-emitting device further has a second electroconductive protective layer formed on the above wiring conductor so as to cover the entirety including its edge.

In the light-emitting device of the present invention, It is preferred that the first electroconductive protective layer formed on the above metal conductor layer so as to cover the entirety including its edge and the second electroconductive protective layer formed on the above wiring conductor so as to cover the entirety including its edge, are gold-plated layers. Further, in the light-emitting device of the present invention, it is preferred that the reflection film is made of silver, and the insulating protective layer is made of glass.

Advantageous Effect of the Invention

According to the present invention, it is possible to provide a light-emitting device mounting a light-emitting element having a reflective metal film on the surface on the side opposite to a light emitting layer, which is excellent in light extraction efficiency as it has high heat dissipation property and high light reflection efficiency, and which can suppress deterioration of the light extraction efficiency due to the deterioration with time.

MODE FOR CARRYING OUT THE INVENTION

Figure 1:
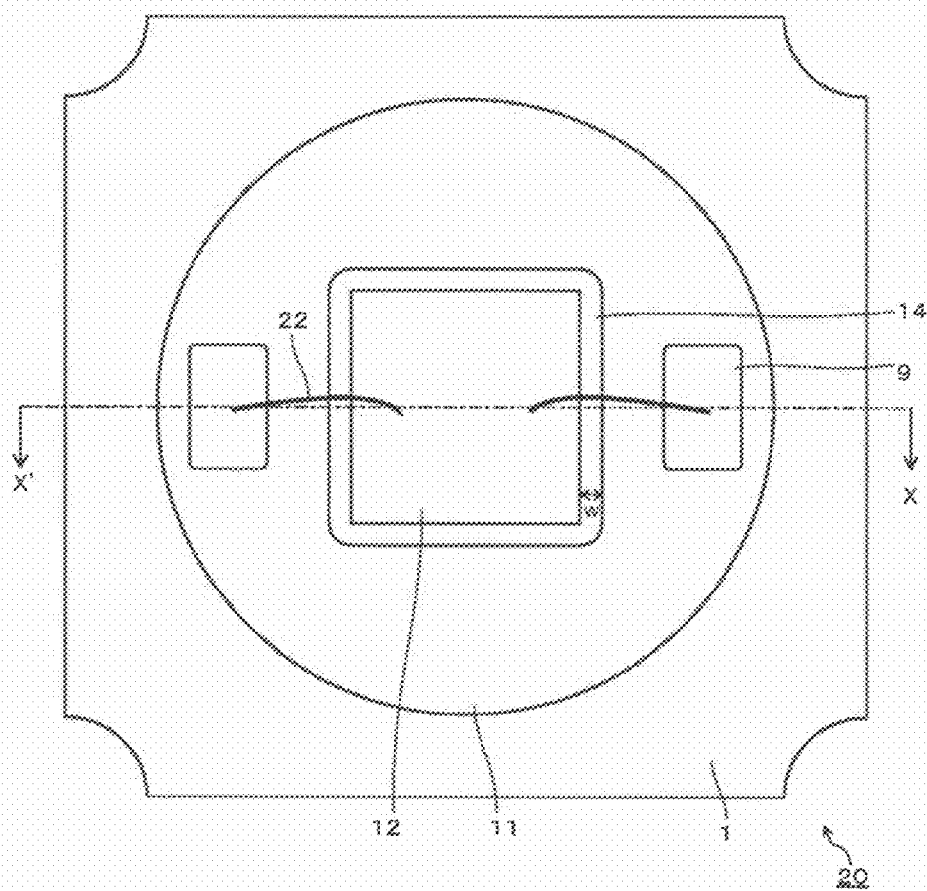
FIG. 1 is a plan view illustrating one embodiment of the light-emitting device of the present invention, using a LTCC substrate, as observed from above.

Now, the embodiments of the present invention will be described with reference to the drawings. However, it should be understood that the present invention is by no means restricted by the following description.

The light-emitting device of the present invention comprises:
a substrate made of an inorganic insulating material and having a mounting surface a part which constitutes a mounting portion on which a light-emitting element is to be mounted,
a metal conductor layer formed on the mounting portion of the above substrate,
a first electroconductive protective layer formed on the above metal conductor layer so as to cover the entirety including its edge and to have an area larger than a metal film of the following light-emitting element,
the light-emitting element having a light emitting layer on the main surface and a reflective metal film on the surface on the side opposite to the main surface, and mounted on the mounting portion of the above substrate so that the metal film faces the first electroconductive protective layer and is located inside the edge of the first electroconductive protective layer, an electroconductive bonding material to bond the above metal film of the above light-emitting element with the above first electroconductive protective layer, a reflection film formed on the mounting surface of the above substrate in such a shape as to exclude at least the first electroconductive protective layer formed on the above metal conductive layer and the vicinity around it, and an insulating protective layer formed on the mounting surface of the above substrate so as to cover the entirety of the above reflection film including its edge.

According to the present invention, at the time of mounting on a substrate of a light-emitting device, a light-emitting element having a reflective metal film on the surface (rear surface) on the side opposite to the main surface having a light emitting layer, the light emitting element is bonded via an electroconductive bonding material on the first electroconductive protective layer coated/formed on a metal conductor layer, and further a reflection film and an insulating protective layer are formed on the mounting surface of a substrate main body excluding the first electroconductive protective layer formed on the metal conductor layer and the vicinity around it, whereby it is possible to obtain a light-emitting device which can sufficiently secure the thermal conductivity and light reflectance, and sufficiently protect e.g. the metal conductor layer or the reflection film from deterioration, in either the region just under the mounting portion for light-emitting element or the other regions in the mounting surface for light-emitting element.

Accordingly, a light-emitting device mounting a light emitting element having a reflective metal film on the rear surface, such as a high output light-emitting element, which is one having high heat dissipation property (thermal conductivity) and high light reflectance, is regarded as a light-emitting device excellent in the light extraction efficiency and capable of emitting light with high brightness. Further, it is possible to prevent deterioration of the metal conductor layer or the reflection layer due to a chemical reaction such as oxidation or sulfurization, whereby it is also possible to greatly suppress deterioration of light intensity caused by reduction of light reflectance with time.

In the light-emitting device of the present invention, the substrate mounting a light-emitting element having a light emitting layer on the main surface and a reflective metal film on the surface on the side opposite to the main surface is preferably a substrate made of an inorganic insulating material. As such a substrate, specifically, an alumina substrate, an aluminum nitride substrate or a LTCC substrate (hereinafter simply referred to as a "LTCC substrate") made of a sintered product of a glass ceramics composition comprising a glass powder and a ceramics filler, may, for example, be mentioned.

In the light-emitting device of the present invention, since the light-emitting element is mounted on the mounting portion of the substrate via an electroconductive bonding material as mentioned above, the thermal conductivity is not affected even when surface irregularities are formed to some extent on the mounting portion for light-emitting element, whereby a member which is difficult to dispose in the case of using e.g. a transparent silicone bonding material, such as a thermal via for increasing the heat dissipation property, can be disposed just under the mounting portion for light-emitting element.

Accordingly, the construction of the light-emitting device of the present invention may be more advantageous when applied to a substrate which by itself has no adequate thermal conductivity, such as an alumina substrate (the thermal conductivity of alumina is about 20 W/m·K) or a LTCC substrate (the thermal conductivity is about 4 W/m·K) and which usually requires another supplementary member having a good thermal conductivity, such as a thermal via, rather than when applied to a substrate formed from a material having a high thermal conductivity (about 200 W/m·K) such as aluminum nitride.

Further, in a case where a reflection film is formed on a mounting surface of a substrate as mentioned below, since the alumina substrate or the aluminum nitride substrate has a high firing temperature, it is impossible to form e.g. a silver reflection film having a high light reflectance at the same time as the production of the substrate. Whereas, the LTCC substrate is advantageous from the viewpoint that the silver reflection film can be formed at the same time as the production of the substrate since the LTCC substrate is produced by low temperature firing. That is, in the light-emitting device of the present invention, as the substrate to be used, a LTCC substrate is preferred from the viewpoints of production efficiency, easy processability, economical efficiency, etc.

Now, the embodiments of the light-emitting device of the present invention will be described so as to correspond to the respective substrates used therein.

(1) Light-Emitting Device Using LTCC Substrate

Figure 2:
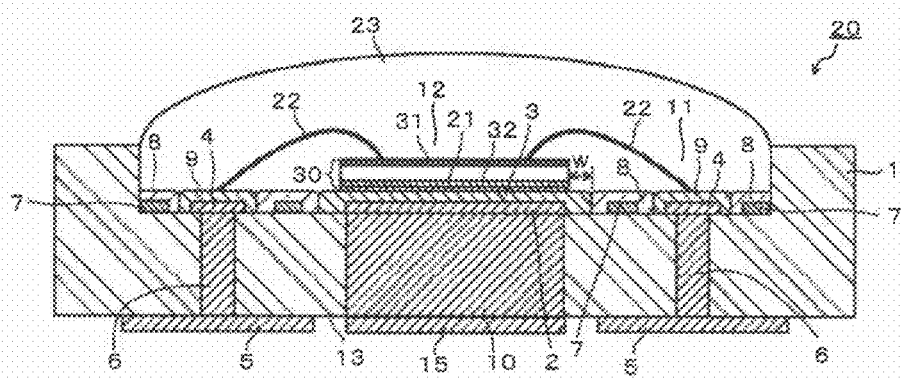
FIG. 2 is a cross-sectional view illustrating a portion corresponding to a line X-X' in FIG. 1 of the embodiment of the light-emitting device shown in FIG. 1.

FIG. 1 is a plan view illustrating one embodiment of the light-emitting device of the present invention, using a LTCC substrate, as observed from above, and FIG. 2 is a cross-sectional view illustrating a portion corresponding to a line X-X' in FIG. 1 of the embodiment of the light-emitting device shown in FIG. 1.

The light-emitting device 20 is a light-emitting device 20 of the present invention in which a light-emitting element 30 having a light emitting layer 31 on the main surface and a reflective metal film 32 on the surface (rear surface) on the side opposite to the main surface, and having such a form that a pair of electrodes are both connected to a substrate by wire bonding (hereinafter referred to as "2 wire type" as the case requires), is mounted on a substrate for mounting light-emitting element. Here, the substrate for mounting light-emitting element is a substrate having prescribed members for mounting light-emitting element, such as a metal conductor layer/a first electroconductive protective layer, a wiring conductor/a second electroconductive protective layer and a reflection film/an insulating protective layer, provided on a substrate main body made of e.g. LTCC.

The substrate for mounting light-emitting element has a substantially flat plate-form substrate main body 1 mainly constituting the substrate for mounting light-emitting element. The substrate main body 1 is made of a sintered product of a glass ceramics composition comprising a glass powder and a ceramics fiber, and one surface (upper side in FIG. 2) is formed into a shape having a cavity, wherein the bottom surface of the cavity constitutes a mounting surface 11 to mount a light-emitting element. Further, a substantially center portion of the mounting surface 11 is a mounting portion 12 on which a light-emitting element is to be practically mounted. The other surface of the substrate main body 1 is a non-mounting surface 13 on which no light-emitting element is to be mounted. The substrate main body 1 preferably has a flexural strength of at least 250 MPa with a view to preventing a damage, etc. during the mounting of a light-emitting element and during the subsequent use thereof.

The shape, thickness, size, etc. of the substrate main body may not particularly be limited, and they may usually be the same as ones used as a substrate for mounting a light-emitting element. Further, the raw material composition, sintering conditions, etc. for the sintered product of a glass ceramics composition comprising a glass powder and a ceramics filler to constitute the substrate main body 1 will be described in the after-mentioned process for producing a substrate for mounting light-emitting element.

On the substrate main body 1, a metal conductor layer 2 is formed on the mounting portion 12 to mount a light-emitting element. Here, the region to form the metal conductor layer 2 may be a region corresponding to the mounting portion, a region containing the entirety or a part of the mounting portion, or a region corresponding to a part of the inside of the mounting portion. The meaning of "formed on the mounting portion" includes all of these categories, but it is preferred that the metal conductor layer 2 is formed so as to substantially agree with the mounting portion 12. Further, a first electroconductive protective layer 3 is formed on the metal conductor layer 2 so as to cover the entirety including its edge and further to have an area larger than a metal film 32 of the light-emitting element 30.

The material constituting the metal conductor layer 2 is not particularly limited so long as it is a metal material having high thermal conductivity, but may, for example, be a metal composed mainly of copper, silver, gold or the like. Among such metals, a metal composed of silver, silver and platinum, or silver and palladium is preferably used. The thickness of the metal conductor layer 2 to be formed may preferably be from 5 to 15 µm. The first electroconductive protective layer 3 to be formed on the metal conductor layer 2 is not particularly limited so long as it is composed of a material having electroconductivity and further having a function to protect the above metal conductor layer from oxidation or sulfurization, but a gold-plated layer is preferred, and a nickel/gold-plated layer structure having gold plating applied on nickel plating is more preferred. With respect to the thickness of the first electroconductive protective layer 3, the nickel-plated layer is preferably from 3 to 20 µm, and the gold-plated layer is preferably from 0.1 to 1.0 µm.

In the light-emitting device 20, the light-emitting element 30 is mounted on the mounting portion 12 of the substrate main body 1 via the electroconductive bonding material 21 so that the reflective metal film 32 faces the first electroconductive protective layer 3 and is located inside the edge of the first electroconductive protective layer 3. Here, the first electroconductive protective layer 3 preferably has a non-mounting region 14 having a width (represented by w in FIG. 1 and FIG. 2) of from 70 to 200 µm around the region having the light-emitting element 30 bonded thereto, i.e. around the mounting portion 12. If such a width is less than 70 µm, it is likely to induce a trouble that a part of the light-emitting element is mounted as deviated from the first electroconductive protective layer 3 in a case where e.g. displacement occurs at the time of mounting a light-emitting element. Further, if such a width exceeds 200 µm, an area where the first electroconductive protective layer 3 is exposed would be increased, and such a portion would absorb light, whereby the light extraction efficiency of the light-emitting device as a whole tends to be deteriorated.

The light-emitting device 20 has a thermal via 10 for reducing the thermal resistance and securing the thermal conductivity. The thermal via 10 is disposed just under the above mounting portion so as to be in contact with the metal conductor layer 2, to extend from the mounting surface 11 of the substrate main body 1 to a non-mounting surface 13 as a surface opposite to the mounting surface so as to be embedded in the substrate main body 1. In this embodiment, the thermal via 10 is a columnar one having substantially the same cross-sectional area as the mounting portion 12, but as e.g. columnar ones having a cross-sectional area smaller than the mounting portion 12, a plurality of them may be disposed just under the mounting portion 12, or it may be disposed as a columnar one having a cross-sectional area larger than the mounting portion 12.

The constituting material for the thermal via 10 is not particularly limited so long as it is a metal material having high thermal conductivity, like the constituting material for the above metal conductor layer 2. As a specific metal material, the same metal material as the above metal conductor layer 2 may be mentioned. Further, the thermal via 10 may be formed separately from the above metal conductor layer 2, or may be integrally formed as the case requires.

Further, the light emitting device 20 in this embodiment has a heat dissipation conductor 15 on the non-mounting surface 13 so as to be in contact with the above thermal via 10. The heat dissipation conductor 15 functions as a contact point between the light emitting device 20 and a heat-dissipating means (not shown) provided outside the light-emitting device. It is preferred that the heat dissipation conductor 15 has almost the same cross section as the thermal via 10, and both cross sections are entirely contacted with each other. Further, the constituting material for the heat dissipation conductor 15 is not particularly limited so long as it is a metal material having high thermal conductivity, like the constituting material for the above metal conductor layer 2 and the thermal via 10, and as a specific metal material, the same metal material may be mentioned. Further, the heat dissipation conductor may be formed separately from the above thermal via 10, or may be integrally formed as the case requires.

Regarding the mounting portion 12, in the case of bonding a light-emitting element by e.g. a transparent silicone bonding material to be used heretofore for increasing the reflectance, planarization is required to secure sufficient thermal conductivity, and it is thereby difficult to dispose the above thermal via to pass through just under the mounting portion. Whereas, in the light-emitting device of the present invention, a light-emitting element is mounted on the mounting portion of the substrate main body by using an electroconductive bonding material as mentioned below, and therefore extreme planarization is not required. Specifically, it is possible to mount a light-emitting element without impairing the thermal conductivity so long as the surface irregularities of the mounting portion are such that the difference in height between the highest portion and the lowest portion is up to about 10 µm.

Further, the light-emitting element 30 to be mounted is not particularly limited so long as it has a light emitting layer 31 on the main surface and the reflective metal film 32 on the surface (rear surface) on the side opposite to the main surface. The reflective metal film may be a metal film made of e.g. aluminum, chromium, copper or silver. The metal film 32 is preferably an aluminum metal film.

Further, in this embodiment, the light-emitting element 30 to be mounted is a 2 wire type light-emitting element in which a pair of electrodes are respectively connected to a substrate by wire bonding, but as in the after-mentioned another embodiment, it is possible to use a 1 wire type light-emitting element in which one of the electrodes is connected to a substrate by wire bonding, and the reflective metal film 32 as an electrode is electrically connected to the first electroconductive protective layer 3 and the metal conductor layer 2 via the electroconductive bonding material 21.

As a type of the light-emitting element, a flip chip bond type in which all the electrodes are disposed on a rear surface is present, but it requires a precision wiring pattern on the mounting portion, and therefore in the case of producing the light-emitting device 20 by using a LTCC substrate, the light-emitting element 30 is preferably a 2 wire type or 1 wire type light-emitting element.

The electroconductive bonding material 21 is not particularly limited so long as it is a bonding material having electroconductivity and high thermal conductivity, capable of bonding the metal film 32 of the light-emitting element 30 and the first electroconductive protective layer 3 with a sufficient adhesion to endure the use. Specifically, e.g. a gold tin solder composed of a proportion of gold 20 mass %:tin 80 mass % or a thermosetting resin paste containing a silver powder which is usually used in the light-emitting device, is treated by a usual method to form an electroconductive bonding material 21 between the metal film 32 of the light-emitting element and the first electroconductive protective layer 3 so as to bond both of them. Here, the thickness of the electroconductive bonding material 21 is preferably from 10 to 200 μm.

In the light-emitting device 20 shown in FIG. 1 and FIG. 2, on the substrate main body 1, wiring conductors 4 to be electrically connected with a pair of electrodes (not shown) of the light-emitting element 30 are mounted at two portions electrically insulated from the metal conductor layer 2 and the first conductive protective layer 3 disposed on the mounting portion 12 of the mounting surface 11. In this embodiment, on such a wiring conductor 4, a second conducive protective layer 9 is formed to cover the entirety including its edge.

The positions of the wiring conductors 4, and the size, shape, etc. of the wiring conductors 4, may suitably be adjusted depending upon the light-emitting element to be mounted on a light-emitting device or the substrate main body to mount the element, but they may have the same construction as wiring conductors in a usual substrate for mounting light-emitting element on which the light-emitting element 30 having the light emitting layer 31 on the main surface and the reflective metal film 32 on the surface (rear surface) on the side opposite to the main surface is mounted by wire bonding. Further, in this embodiment, the wiring conductors 4 are provided at the positions which can be electrically insulated from the above metal conductor layer 2 and the first conductive protective layer 3 on the mounting surface 11, but as the case requires, it is also possible to provide steps such as concaves on the mounting surface and mount the wiring conductors on the stepped portions (on the bottom surfaces in the case of the concaves).

Usually, the constituting material for the wiring conductors 4 may not particularly be limited so long as it is the same constituting material as for the wiring conductors to be used for a substrate for mounting light-emitting element, and specifically, the same metal material as the above constituting material for the metal conductor layer 2 may be mentioned. The preferred embodiment is also the same. Further, a preferred thickness of the wiring conductors 4 may be from 5 to 15 μm.

Further, in the same manner as in the above first electroconductive protective layer 3 formed on the metal conductor layer 2, the second electroconductive protective layer 9 is one having a function to protect the wiring conductors 4 from oxidation or sulfurization, and its embodiment may be the same as the above first electroconductive protective layer 3, including its preferred embodiment.

The second electroconductive protective layers 9 provided on the above wiring conductors 4 at two positions, are electrically connected to a pair of electrodes of the light-emitting element 30 respectively, so as to correspond to one-to-one by bonding wires 22. Usually, such a bonding wire is not particularly limited so long as it is a bonding wire made of a metal such as gold having corrosion resistance, which is commonly used for a light-emitting device in which a light-emitting element is mounted by wire bonding. On the other hand, on the non-mounting surface 13, external electrode terminals 5 to be electrically connected to an external circuit are provided at two positions, and in the interior of the substrate main body 1, via conductors 6 for electrically connecting the above pair of wire conductors 4 and the external electrode terminals 5 respectively, are provided.

Usually, the shapes or constituting materials of the external electrode terminals 5 and the via conductors 6 are not particularly limited so long as they are the same ones as used for a substrate for mounting light-emitting element. Further, the positions of the external electrode terminals 5 and the via conductors 6 are also not particularly limited so long as they are disposed so as to be electrically connected to the external circuit (not shown) from the wiring conductors 4.

In the light-emitting device 20, the reflection film 7 is formed on the mounting surface 11 of the substrate main body 1 in such a shape as to exclude the first electroconductive protective layer 3 formed on the metal conductor layer 2 and the vicinity around it and the second electroconductive protective layer 9 formed on the wiring conductor 4 and the vicinity around it, and further the insulating protective layer 8 is provided so as to cover the entirety of the reflection film 7 including its edge.

A constituting material for the reflection film 7 may not particularly be limited so long as it is a metal material having high reflectance. Specifically, it is possible to use not only silver but also a metal powder composed of silver and palladium or a metal powder composed of silver and platinum. Among them, a reflection film made of silver is preferred in the present invention. The thickness of the reflection film 7 is preferably at least 5 μm so as to obtain sufficient reflection performance, and preferably at most 50 μm in consideration of the economical efficiency, the deformation due to a difference in the thermal expansion from the substrate, etc.

In order that the reflection film 7 is electrically insulated from the first electroconductive protective layer 3 on the metal conductor layer 2 and the second electroconductive protective layer 9 on the wiring conductor 4, provided on the mounting surface 11 as mentioned above, the reflection film 7 is provided to maintain a distance therefrom. The distance between the edge of the reflective film 7 and the edge of the first electroconductive protective layer 3 or the second electroconductive protective layer 9 is preferably from about 50 to 150 μm to sufficiently improve the reflection efficiency of the substrate surface while securing an adequate electrical insulation property between both of them. By disposing the reflection film 7 on the mounting surface 11 in such a manner, it is possible to sufficiently improve light extraction efficiency of the light emitting device.

In the light-emitting device of this embodiment, the edge of the insulating protective layer 8 provided so as to cover the entirety of the reflection film 7 including its edge, is provided so as to be in contact with the first electroconductive protective layer 3 on the metal conductor layer 2 and the edge of the second electroconductive protective layer 9 on the wiring conductor 4. By such a construction, there is no region of the substrate main body 1 being not covered in the mounting surface 11, and therefore it is possible to sufficiently prevent light emitted from the light-emitting element from entering into the substrate main body. Further, the distance between the edge of the reflection film 7 and the edge of the insulating protective layer 8 covering it, is the same as the above distance between the edge of the reflection film 7 and the edge of the first electroconductive protective layer 3 or the edge of the second electroconductive protective layer 9. Furthermore, the thickness of the insulating protective layer 8 is preferably from 10 to 50 µm in consideration of e.g. the thermal conductivity and the deformation due to a difference in the thermal expansion from the substrate.

A material to constitute the insulating protective layer 8 is not particularly limited so long as it is an insulating material which can sufficiently protect the reflection film 7 from e.g. oxidation or sulfurization. Specifically, glass or a resin having a low gas permeability, such as an epoxy resin or a silicone resin may be mentioned. Further, preferred is glass since it is possible to form a reflection film and an insulating protective layer at the same time at the time of firing a LTCC substrate constituting the substrate main body, and further gas permeability is sufficiently low.

Further, the light-emitting device 20 is provided with a sealing layer 23 to fill the interior of a cavity so as to cover the metal conductor layer 2/the first electroconductive protective layer 3, the wiring conductors 4/the second electroconductive protective layer 9 and the reflection film 7/the insulating protective layer 8, formed on the mounting surface 11 being the bottom portion of the cavity of the above substrate for mounting light-emitting element, and the light-emitting element 30 mounted on the mounting portion 12 and the bonding wires 22, and further to have a certain thickness on the upper portion thereof. As a sealing material to constitute the sealing layer 23, usually, a sealing material such as a silicone resin or an epoxy resin which is commonly used as a sealing material for a light-emitting device may be used without any particular limitation.

In the foregoing, an embodiment has been described with respect to a light-emitting device in which a two wire-type light-emitting element having a light emitting layer on the main surface and a reflective metal film on the surface (rear surface) on the side opposite to the main surface is mounted on a LTCC substrate for mounting light-emitting element. Now, another embodiment of the light-emitting device in which a 1 wire type light-emitting element having a light emitting layer on the main surface and a reflective metal film on the rear surface is mounted on a LTCC substrate for mounting light-emitting element, will be described with reference to FIG. 3 and FIG. 4.

Figure 3:
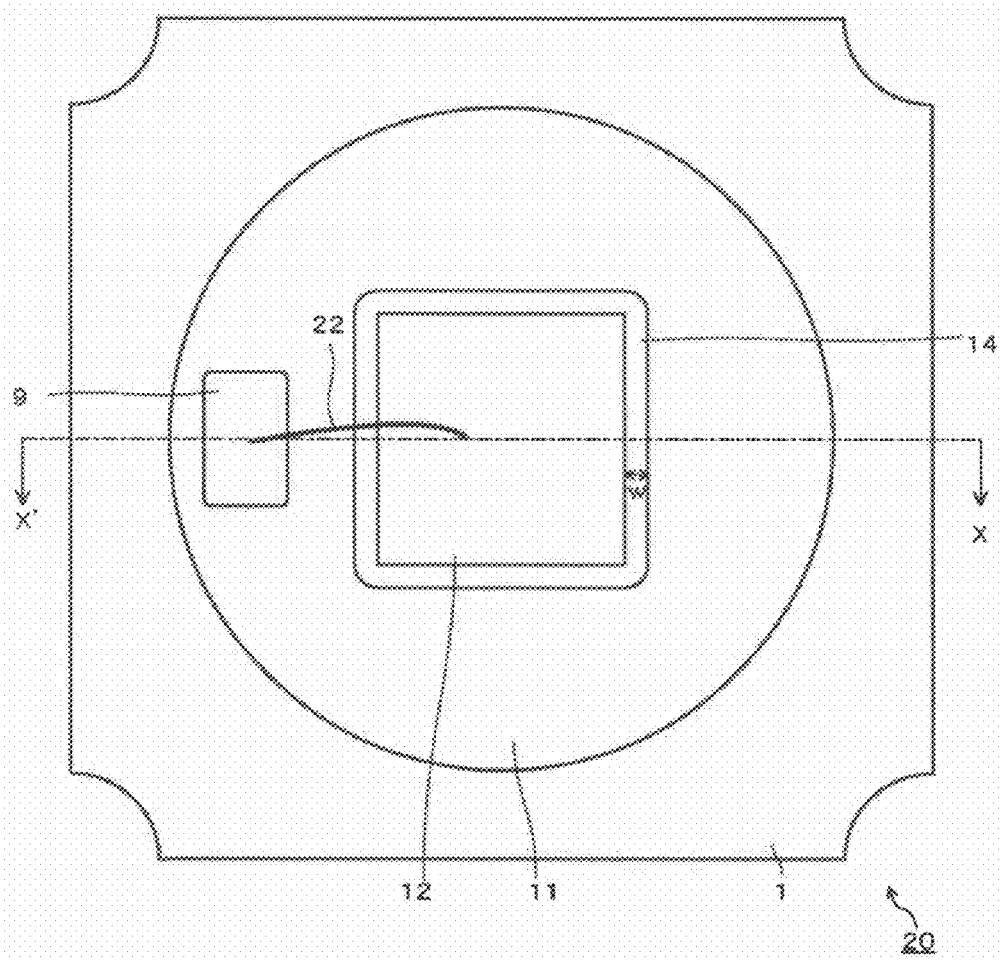
FIG. 3 is a plan view illustrating another embodiment of the light-emitting device of the present invention, using a LTCC substrate, as observed from above.
Figure 4:
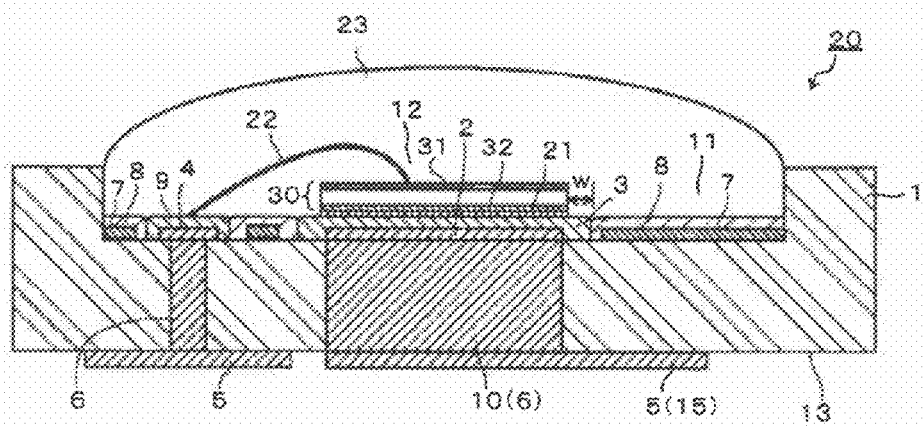
FIG. 4 is a cross-sectional view illustrating a portion corresponding to a line X-X' in FIG. 3 in the embodiment of the light-emitting device shown in FIG. 3.

FIG. 3 is a plan view illustrating one embodiment of the above light-emitting device of the present invention, in which a 1 wire type light-emitting element is mounted on a LTCC substrate for mounting light-emitting element, as observed from above, and FIG. 4 is a cross-sectional view illustrating a portion corresponding to a line X-X' in FIG. 3 in the embodiment of the light-emitting device shown in FIG. 3.

The light-emitting device 20 is a light-emitting device 20 of the present invention, in which a light-emitting element 30 having a light emitting layer 31 on the main surface and a reflective metal film 32 on the surface (rear surface) on the side opposite to the main surface, and having such a form that one of a pair of electrodes is connected to a substrate by wire bonding, is mounted on a substrate for mounting light-emitting element.

In the light-emitting device 20 shown in FIGS. 3 and 4, the construction of the substrate main body 1, the metal conductor layer 2, the first electroconductive protective layer 3, the thermal via 10 and the electroconductive bonding material 21 may be entirely the same construction as in the above light-emitting device mounting the 2 wire type light-emitting element. Here, in the light-emitting element 30, one (not shown) of the electrodes is electrically connected to the following wiring conductor 4 by the bonding wire 22, but the other electrode is constructed so that the reflective metal film 32 on the rear surface of the light-emitting element has the functions.

As shown in FIG. 4, the metal film 32 in the light-emitting element 30 is electrically connected in the order of the electroconductive bonding material 21, the first electroconductive protective layer 3, the metal conductor layer 2 and the thermal via 10. Thus, in this embodiment, the thermal via 10 is one which also performs a role of a via conductor 6 at the same time. The light-emitting device 20 of this embodiment further has an external electrode terminal 5 on the non-mounting surface 13 so as to be connected to the thermal via 10 (via conductor 6) and further electrically connected to an external circuit via itself. Here, the external electrode terminal 5 also has a function as a heat dissipation conductor 15, i.e. a function as a point for contacting the light-emitting device 20 with a heat-dissipating means (not shown) provided outside the light-emitting device.

In the light-emitting device 20 of this embodiment shown in FIGS. 3 and 4, the wiring conductor 4 electrically connected to the electrode of the light-emitting element by wire bonding may be provided at one location on the mounting surface 11. The construction of the wiring conductor 4 may be entirely the same construction as in the above light-emitting device mounting the 2 wire type light-emitting element, except that the wiring conductor 4 is provided at one location instead of two locations. Further, the light-emitting device 20 has, as members around the wiring conductor 4, the same via conductor 6 electrically connected to the wiring conductor 4, the external electrode terminal 5 (serving also as a heat dissipation conductor 15), and further the second electroconductive protective film 9 formed so as to cover the entirety of the wiring conductor 4 including its edge, as in the above light-emitting device mounting the 2 wire type light-emitting element. Thus, such a construction is entirely the same as in the light-emitting device mounting the above 2 wire type light-emitting element except that it has the members around the wiring conductor 4 at one location instead of two locations.

In the light-emitting device 20 of this embodiment shown in FIGS. 3 and 4, the reflection film 7 and the insulating protective layer 8 provided on the mounting surface 11 may also have the same construction as in the light-emitting device mounting the above 2 wire type light-emitting element. Here, in this embodiment, the second electroconductive protective film 9 formed so as to cover the entirety of the wiring conductor 4 including its edge is formed only at one location, and therefore the reflection film 7 and the second electroconductive protective film 9 are formed to have a covering area larger than the light-emitting device mounting the 2 wire type light-emitting element.

Further, the light-emitting device 20 is provided with the same sealing layer 23 as in the above light-emitting device mounting the 2 wire type light-emitting element, to fill the interior of a cavity so as to cover the metal conductor layer 2/the first electroconductive protective layer 3, the wiring conductors 4/the second electroconductive protective layer 9, and the reflection film 7/the insulating protective layer 8, formed on the mounting surface 11 being the bottom portion of the cavity of the above substrate for mounting light-emitting element, and the light-emitting element 30 mounted on the mounting portion 12 and the bonding wire 22, and further to have a certain thickness on the upper portion thereof.

The light-emitting device of the present invention using such a LTCC substrate can be produced by a usual production process in such a manner that a LTCC substrate for mounting light-emitting element, having the above structural features, i.e. a substrate having prescribed members provided for mounting a light-emitting element such as a metal conductor layer/a first electroconductive protective layer, a wiring conductor/a second electroconductive protective layer and a reflection film/an insulating protective layer, on a LTCC substrate main body, is produced by a material and a production process usually used, then a light-emitting element having a light emitting layer on the main surface and a metal film on the rear surface, is bonded on the LTCC substrate for mounting light-emitting element by an electroconductive bonding material, wire bonding is carried out, and then a sealing layer is formed thereon.

Further, the LTCC substrate for mounting light-emitting element to be used in the light-emitting device of the present invention can be produced, for example, by a production process comprising the following steps (A) to (F). Further, in the following description, taking as an example the LTCC substrate for mounting light-emitting element of the light-emitting device shown in FIG. 1 and FIG. 2, components to be used for its production will be described by attaching the same symbols as for the components in the completed product. Here, a production process in which an overcoat glass layer is used as an insulating protective layer will be described.

(A) A step for preparing a main body green sheet 1 having a mounting surface, a part of which constitutes a mounting portion on which a light-emitting element is to be mounted, in which a main body substrate of a substrate for mounting light-emitting element is constructed by using a glass ceramics composition comprising a glass powder and a ceramics filler (hereinafter referred to as "step for preparing main body green sheet").

(B) A step for forming the metal conductor paste layer 2 on the mounting portion 12 of the substrate main body, the non-fired thermal via 10 embedded just under the metal conductor paste layer 2 so as to extend from the mounting surface 11 to the non-mounting surface 13, the heat dissipation conductor paste layer 15 formed on the non-mounting surface 13 so as to be in contact with the non-fired thermal via 10, the wiring conductor paste layers 4 provided at two locations on the mounting surface 11 which are not electrically connected to the metal conductor paste layer 2, the via conductor paste layer 6 for electrically connecting the wiring conductor paste layers 4 with the external electrode terminal conductive paste layer 5 formed on the following non-mounting surface 13, and the external electrode terminal conductive paste layer 5 on the non-mounting surface 13, for electrically connecting the wiring conductor paste layer 4 with an exterior circuit via a via conductor paste layer 6 and itself (hereinafter referred to as "step for forming conductor paste layer"), (C) A step of forming a reflection film paste layer 7 by screen printing, on a mounting surface so as to exclude the above metal conductor paste layer 2 and the vicinity around it, and the wiring conductor paste layer 4 and the vicinity around it (hereinafter referred to as "step for forming reflection film paste layer"), (D) A step of forming an overcoat glass paste layer 8 on the mounting surface 11 so as to cover the entirety of the above reflection film paste layer 7 including its edge and to exclude the above metal conductor paste layer 4 and the vicinity around it and the above wiring conductor paste layer 4 and the vicinity around it thereby to obtain a non-sintered substrate for mounting light-emitting element (hereinafter referred to as "step for forming overcoat glass paste layer").

(E) A step of firing the above non-sintered substrate for mounting light-emitting element at from 800 to 930° C. (hereinafter referred to as "firing step").

(F) A step of providing the first electroconductive protective layer 3 so as to cover the entirety of the above metal conductor layer 2 including its edge and the second electroconductive protective layer 9 so as to cover the entirety of the above wiring conductor 4 including its edge (step for forming electroconductive protective layer).

(A) Step for Preparing Main Body Green Sheet

The main body green sheet 1 can be produced by preparing a slurry by adding a binder and, as the case requires, a plasticizer, a dispersing agent, a solvent, etc. to a glass ceramics composition containing a glass powder (a glass powder for substrate main body) and a ceramics filler, forming it by e.g. a doctor blade method into a sheet-form, followed by drying. Further, as shown in FIG. 2, the main body green sheet 1 is prepared by e.g. laminating a plurality of green sheets, as the case requires, so that the substrate main body 1 finally has a cavity on the upper surface and the bottom surface of the cavity constitutes the mounting surface 11.

The glass powder for substrate main body is not necessarily limited, but one having a glass transition point (Tg) of from 550° C. to 700° C. is preferred. If the glass transition point (Tg) is lower than 550° C., binder burn out is likely to be difficult, and if it exceeds 700° C., the shrinkage start temperature tends to be high so that the dimension precision is likely to deteriorate.

Further, it is preferred that when it is fired at a temperature of from 800° C. to 930° C., crystals will precipitate. In the case of one whereby no crystals will precipitate, it is likely that no adequate mechanical strength can be obtained. Further, one having a crystallization peak temperature (Tc) of at most 880° C. as measured by DTA (differential thermal analysis) is preferred. If the crystallization peak temperature (Tc) exceeds 880° C., the dimension precision is likely to deteriorate.

As such a glass powder for substrate main body, preferred is, for example, one comprising from 57 mol % to 65 mol % of $SiO_2$, from 13 mol % to 18 mol % of $B_2O_3$, from 9 mol % to 23 mol % of CaO, from 3 mol % to 8 mol % of $Al_2O_3$, and from 0.5 mol % to 6 mol % in total of at least one member selected from $K_2O$ and $Na_2O$. By using such a glass powder, it becomes easy to improve the planarity of the surface of the substrate main body.

Here, $SiO_2$ will be a network former of glass. If the content of $SiO_2$ is less than 57 mol %, it tends to be difficult to obtain stabilized glass, and the chemical durability is likely to deteriorate. On the other hand, if the content of $SiO_2$ exceeds 65 mol %, the glass melting temperature or the glass transition point (Tg) tends to be too high. The content of $SiO_2$ is preferably at least 58 mol %, more preferably at least 59 mol %, particularly preferably at least 60 mol %. Further, the content of $SiO_2$ is preferably at most 64 mol %, more preferably at most 63 mol %.

$B_2O_3$ will be a network former of glass. If the content of $B_2O_3$ is less than 13 mol %, the glass melting point or the glass transition point (Tg) is likely to be too high. On the other hand, if the content of $B_2O_3$ exceeds 18 mol %, it tends to be difficult to obtain stable glass, and the chemical durability is also likely to deteriorate. The content of $B_2O_3$ is preferably at least 14 mol %, more preferably at least 15 mol %. Further, the content of $B_2O_3$ is preferably at most 17 mol %, more preferably at most 16 mol %.

$Al_2O_3$ is added in order to increase the stability, chemical durability and strength of glass. If the content of $Al_2O_3$ is less than 3 mol %, the glass is likely to be unstable. On the other hand, if the content of $Al_2O_3$ exceeds 8 mol %, the glass melting point or the glass transition point (Tg) is likely to be too high. The content of $Al_2O_3$ is preferably at least 4 mol %, more preferably at least 5 mol %. Further, the content of $Al_2O_3$ is preferably at most 7 mol %, more preferably at most 6 mol %.

CaO is added in order to increase the stability of glass or the precipitation property of crystals and to lower the glass melting temperature or the glass transition point (Tg). If the content of CaO is less than 9 mol %, the glass melting point is likely to be too high. On the other hand, if the content of CaO exceeds 23 mol %, the glass is likely to be unstable. The content of CaO is preferably at least 12 mol %, more preferably at least 13 mol %, particularly preferably at least 14 mol %. Further, the content of CaO is preferably at most 22 mol %, more preferably at most 21 mol %, particularly preferably at most 20 mol %.

$K_2O$ or $Na_2O$ is added in order to lower the glass transition point (Tg). If the total content of $K_2O$ and $Na_2O$ is less than 0.5 mol %, the glass melting point or the glass transition point (Tg) is likely to be too high. On the other hand, if the total content of $K_2O$ and $Na_2O$ exceeds 6 mol %, the chemical durability, particularly the acid resistance, is likely to deteriorate, and the electrical insulation property is also likely to deteriorate. The total content of $K_2O$ and $Na_2O$ is preferably from 0.8 mol % to 5 mol %.

The glass powder for substrate main body is not necessarily limited to one comprising only the above-described components and may contain other components within a range to satisfy various properties such as the glass transition point (Tg). When it contains such other components, their total content is preferably at most 10 mol %.

The glass powder for substrate main body can be obtained by producing a glass having the above-described glass composition by a melting method and grinding it by a dry grinding method or a wet grinding method. In the case of a wet grinding method, it is preferred to employ water as a solvent. The grinding can be carried out by using a grinding machine such as a roll mill, a ball mill or a jet mill.

The 50% particle size ($D_{50}$) of the glass powder for substrate main body is preferably from 0.5 µm to 2 µm. If the 50% particle size of the glass powder for substrate main body is less than 0.5 µm, the glass powder is likely to cohere, whereby the handling tends to be difficult, and it tends to be difficult to uniformly disperse it. On the other hand, if the 50% particle size of the glass powder for substrate main body exceeds 2 µm, the glass softening temperature is likely to rise, or the sintering is likely to be inadequate. The particle size can be adjusted, for example, by classification which is carried out after the grinding, as the case requires. In this specification, the particle size is a value obtained by a particle size analyzer of a laser diffraction scattering method. As the particle size analyzer of a laser diffraction scattering method, a laser diffraction particle size analyzer (tradename: SALD2100 manufactured by Shimadzu Corporation) was used.

On the other hand, as the ceramics filler, one used for the production of a LTCC substrate heretofore, may be used without any particular restriction, and an alumina powder, a zirconia powder or a mixture of an alumina powder and a zirconia powder is preferably employed. The 50% particle size ($D_{50}$) of the ceramics filler is preferably e.g. from 0.5 µm to 4 µm.

The above glass powder for substrate main body and the ceramics filler are blended and mixed, for example, so that the glass powder would be from 30 mass % to 50 mass %, and the ceramics filler would be from 50 mass % to 70 mass %, to obtain a glass ceramics composition. To this glass ceramics composition, a binder and, as the case requires, a plasticizer, a dispersing agent, a solvent, etc. are added to obtain a slurry.

As the binder, for example, a polyvinyl butyral or an acrylic resin may be suitably used. As the plasticizer, for example, dibutyl phthalate, dioctyl phthalate or butylbenzyl phthalate may be employed. Further, as the solvent, an organic solvent such as toluene, xylene, 2-propanol or 2-butanol may suitably be employed.

The slurry thus obtained is subjected to a working procedure of e.g. forming it into a sheet-form by e.g. a doctor blade method, followed by drying, and as the case requires, laminating a plurality of green sheets, whereby a main body green sheet 1 can be obtained which has a cavity on the upper surface so that the cavity bottom surface constitutes a mounting surface 11.

(B) Step for Forming Conductor Paste Layer

Then, on the mounting portion 12 positioned at a substantially center portion of the main body green sheet 1 thus obtained, the metal conductor paste layer 2 is formed at a substantially the same position as the mounting portion, the non-fired thermal via 10 is embedded just under the metal conductor past layer 2 so as to extend from the mounting surface 11 to the non-mounting surface 13, the heat dissipation conductor paste layer 15 is formed on the non-mounting surface 13 so as to be in contact with the non-fired thermal via 10, the wiring conductor paste layers 4 are provided at two locations on the mounting surface 11 which are not electrically connected to the metal conductor paste layer 2, the via conductor paste layer 6 is formed for electrically connecting the wiring conductor paste layer 4 with the external electrode terminal conductive paste layer 5 formed on the following non-mounting surface 13, and the external electrode terminal conductive paste layer 5 is formed on the non-mounting surface 13, so as to electrically connect the wiring conductor paste layer 4 with an exterior circuit via the via conductor paste layer 6 and itself, so as to have prescribed sizes and shapes, respectively. Hereinafter, such a main body green sheet having various conductor paste layers formed is called a main body green sheet 1 provided with conductor paste layers.

As a method for forming the metal conductor paste layer 2, the wiring conductor paste layer 4, the external electrode terminal conductor paste layer 5, the via conductor paste layer 6, the non-fired thermal via 10 or the heat dissipation conductor paste layer 15, a method of applying and filling a conductor paste by a screen printing method may be mentioned. The thicknesses of the metal conductor paste layer 2, the wiring conductor paste layer 4, the external electrode terminal conductor paste layer 5 and the heat dissipation conductor paste layer 15 to be formed are adjusted so that the thicknesses of the finally obtainable metal conductor layer, wiring conductor layer, external electrode terminals, heat dissipation conductor, etc. would be prescribed thicknesses.

As the conductor paste, it is possible to use one having a vehicle such as ethylcellulose and, as the case requires, a solvent etc. added to a metal powder composed mainly of e.g. copper, silver, gold or the like to form a paste. Further, as the above metal powder, a metal powder composed of silver, or a metal powder composed of silver and platinum or palladium, may preferably be employed.

(C) Step for Forming Reflection Film Paste Layer

In the step (C) for forming reflection film paste layer, the reflection film paste layer 7 containing a material having reflectivity is formed to form a reflection film by screen printing so as to exclude a region having the metal conductor paste layer 2 formed on the mounting surface 11 of the above obtained main body green sheet 1 provided with conductor paste layers and the vicinity around it, and a region having the wiring conductor paste layer 4 formed and the vicinity around it. Further, when e.g. the wiring conductor paste and the reflection film paste are made of the same paste material, the reflection film paste layer-forming step (C) may be carried out at the same time as forming the metal conductor paste layer 2 and the wiring conductor paste layer 4 in the above step (B).

The paste for reflection film to be used for the above screen printing is a paste containing a material having reflectivity to form the reflection film. As such a material, as mentioned above, silver, a mixture of silver and palladium or a mixture of silver and platinum may, for example, be mentioned. However, for the above-mentioned reason, silver is preferably employed. As the paste for reflection film, it is possible to employ one having a vehicle such as ethylcellulose and, as the case requires, a solvent, etc. added to a metal powder composed mainly of such a material to form a paste. The thickness of the paste layer 7 for reflection film to be formed is adjusted so that the finally obtainable reflection film 7 will have the above-described desired thickness.

(D) Step for Forming Overcoat Glass Paste Layer

In the step (D) for forming overcoat glass paste layer, an overcoat glass paste layer 8 is formed on the above mounting surface 11 by screen printing so as to cover the entirety of the reflection film paste layer 7 including its edge, formed by the above step (C), and to exclude a region having the metal conductor paste layer 2 formed in the above step (B) and the vicinity around it, and the wiring conductor paste layer 4 formed in the above step (B) and the vicinity around it. And it is thereby possible to obtain a non-sintered substrate for mounting light-emitting element.

The overcoat glass paste may be one prepared by adding a vehicle such as ethylcellulose and, as the case requires, a solvent, etc. to a glass powder (glass powder for glass film) to form a paste. The thickness of the overcoat glass paste layer 8 to be formed, is adjusted so that the thickness of the finally obtainable overcoat glass film 8 would be the above-mentioned desired thickness.

The glass powder for overcoat glass film may be one whereby a film-form glass is obtainable by firing in the firing step (E) to be carried out after the step (D), and its 50% particle size ($D_{50}$) is preferably at least 0.5 μm and at most 2 μm. Further, the surface roughness Ra of the overcoat glass film 8 may be adjusted by the particle size of the glass powder for overcoat glass film. That is, by using, as the glass powder for overcoat glass film, one which can be sufficiently melted during firing and is excellent in fluidity, it is possible to reduce the surface roughness Ra.

(E) Firing Step

After the above step (D), the obtained non-sintered substrate for mounting light-emitting element is subjected to binder burn out to remove the binder etc., as the case requires and then, firing is carried out to sinter the glass ceramics composition, etc.

The binder burn out can be carried out by holding the substrate, for example, at a temperature of from 500° C. to 600° C. for from 1 hour to 10 hours. If the binder burn out temperature is lower than 500° C. or the binder burn out time is less than 1 hour, binder, etc. may not sufficiently be removed. On the other hand, when the binder burn out temperature is about 600° C., and the binder burn out time is about 10 hours, the binder, etc. can be sufficiently removed, and if the binder burn out temperature or time exceeds such a level, the productivity, etc. may deteriorate.

Further, the firing can be carried out by suitably adjusting the time within a temperature range of form 800° C. to 930° C. in consideration of the productivity and securing a dense structure of the substrate main body. Specifically, it is preferred to maintain the substrate at a temperature of from 850° C. to 900° C. for from 20 minutes to 60 minutes, and particularly preferably, at a temperature of from 860° C. to 880° C. If the firing temperature is lower than 800° C., one having a dense structure of the substrate main body may not be obtainable. On the other hand, if the firing temperature exceeds 930° C., the productivity etc. may deteriorate, for such a reason that the substrate main body itself undergoes deformation. Further, in a case where a metal paste containing a metal powder composed mainly of silver, is used as the above conductor paste or paste for reflection film, if the firing temperature exceeds 880° C., softening proceeds excessively, and a prescribed shape may not be maintained.

(F) Step for Forming Electroconductive Protective Layer

Thus, the non-sintered substrate for mounting light-emitting element is fired, and on the fired substrate thus obtained, the first electroconductive protective layer 3 is formed so as to cover the entirety of the above metal conductor layer 2 including its edge, and the second electroconductive protective layer 9 is formed so as to cover the entirety of the above wiring conductor 4 including its edge, so as to have prescribed sizes and shapes. And it is thereby possible to obtain a LTCC substrate for mounting light-emitting element to be used for the production of the light-emitting device of the present invention.

Now, as a specific method for forming the first electroconductive protective layer 3 and the second electroconductive protective layer 9, a method for forming a Ni/Au-plated layer obtainable by carrying out nickel (Ni) plating and then gold (Au) plating, will be described, which is preferred in the light-emitting device of the present invention.

A nickel plate is formed to have a thickness of from 3 to 20 μm by electrolytic plating using e.g. a nickel sulfamic acid bath. A gold plate can be formed to have a thickness of from 0.1 to 1.0 μm by electrolytic plating using e.g. a gold potassium cyanide bath.

In the foregoing, the method for producing a LTCC substrate for mounting light-emitting element has been described, but the main body green sheet 1 may not necessarily be composed of a single green sheet, but may be one obtained by laminating a plurality of green sheets. Further, the sequential order for forming the respective portions may suitably be changed within a range where the production of the LTCC substrate for mounting light-emitting element is possible.

(2) Light-Emitting Device Using Alumina Substrate

The construction of the light-emitting device of the present invention using an alumina substrate may be the same as the construction of the light-emitting device of the present invention using the above LTCC substrate, except for the constituting material for the member.

As the substrate main body, a usual alumina substrate can be used without particular limitation. The firing temperature of the alumina substrate is from 1,400 to 1,700° C. i.e. higher than the above LTCC substrate, and therefore in a case where metal layers such as the metal conductor layer 2, the wiring conductor 4, the reflection film 7, the thermal via 10, the external electrode terminal 5 and the via conductor 6 are formed at the same time as firing the alumina substrate main body to be a substrate for mounting light-emitting element, a high-melting point metal such as tungsten or molybdenum is used as the metal for a conductor. Further, regarding the insulating protective layer 8, in the case of glass, it is applicable to high temperature firing by changing the composition from one used for the above LTCC substrate.

Whereas, when not a high melting point metal such as tungsten or molybdenum, but a low-melting point metal such as silver or copper having good thermal conductivity or reflectivity, is to be used, it is possible that a green sheet is fired to form an alumina substrate, and then, at desired positions on the substrate, metal layers such as the metal conductor layer 2, the wiring conductor 4, the reflection film 7, the thermal via 10, the external electrode terminal 5 and the via conductor 6 are formed by a proper combination of a screen printing method, a sputtering deposition method and a jet coating method. As such, a preferred metal is selected for every member, and it is possible to suitably select whether it should be formed at the time of firing or after the firing. Further, as disclosed in Patent Document 1, depending upon the member, a laminated one having a first layer of a high-melting point metal and a second layer of a low-melting point metal may be used as the metal layer.

Further, in a case where the reflection layer 7 is formed at the same time as firing, the insulating protective layer 8 may be formed at the time of firing the substrate by using the above glass capable of firing at a high temperature, but in a case where the reflection film 7 is separately provided after firing, the insulating protective layer 8 may be formed together in the same step if possible, or formed in a separate step. In such a case, it is possible to form the insulating protective layer 8 by using a resin such as an epoxy resin or a silicone resin.

A process for producing an alumina substrate for mounting light-emitting element (a type wherein metal layers are formed after firing the green sheet) to be used in the light-emitting device of the present invention will be described stepwise.

(a) Step for Forming Main Body Green Sheet

The main body green sheet 1 can be formed by adding a binder and, as the case requires, a plasticizer, a solvent, etc. to an alumina composition containing an alumina powder and a sintering assistant, to prepare a slurry, and forming the slurry into a sheet-form by e.g. a doctor blade method, followed by drying.

The 50% particle size ($D_{50}$) of the alumina powder is preferably from 0.5 μm to 2 μm. If $D_{50}$ of the alumina powder is less than 0.5 μm, the alumina powder is likely to cohere, whereby the handling tends to be difficult, and it tends to be difficult to uniformly disperse it. On the other hand, if $D_{50}$ exceeds 2 μm, the sintering is likely be inadequate. Further, in this specification, the particle size is a value obtained by a particle size analyzer of a laser diffraction scattering method.

As the sintering assistant, one commonly used in the production of an alumina substrate, may be employed. For example, a mixture of $SiO_2$ and an alkaline earth metal oxide, or a rare-earth element oxide (especially a $Y_2O_3$ type assistant containing $Y_2O_3$ as a main component) may suitably be employed. $D_{50}$ of the sintering assistant is preferably at least 0.5 μm and at most 4 μm.

For example, an alumina powder and a sintering assistant may be blended and mixed so that the alumina powder would be at least 80 mass % and at most 99 mass %, and the sintering agent would be at least 1 mass % and at most 20 mass %, to obtain an alumina composition, and further, by adding a binder and, if required, a plasticizer, a solvent, etc. to such an alumina composition, a slurry can be obtained.

As the binder, for example, a polyvinyl butyral or an acrylic resin may be suitably used. As the plasticizer, for example, dibutyl phthalate, dioctyl phthalate or butylbenzyl phthalate may be employed. Further, as the solvent, an aromatic or alcohol type organic solvent such as toluene, xylene or butanol may be employed. Further, a dispersing agent or a leveling agent may also be used in combination.

The main body green sheet 1 thus formed is cut into a prescribed size by using a punching machine or a punch, and at the same time, through holes for via conductor and thermal via are formed at prescribed positions by punching.

(b) Step for Sintering Main Body Green Sheet

The non-fired main body green sheet 1 is heated at a temperature of from 500° C. to 600° C. to carry out binder burn out whereby a binder such as a resin contained in the main body green sheet 1 is decomposed/removed. In the case of laminating non-fired main body green sheets, a plurality of them are laminated and integrated by heating and pressing them while positioning them, and then the above-mentioned binder burn out is carried out. Thereafter, heating is carried out at a temperature of from about 1,100 to 1,600° C., to fire the alumina composition constituting the main body green sheet 1 to prepare an alumina substrate.

(c) Step for Forming Conductor Paste Layer

On the surface of such an alumina substrate, a conductor paste is printed by means of e.g. screen printing to form a metal conductor paste layer 2, a wiring conductor paste layer 4, an external electrode terminal conductor paste layer 5 and a heat dissipation conductor layer 15. Further, the conductor paste is filled in the above through hole to form a via conductor paste layer 6 or a non-fired thermal via layer 10. As the conductor paste, one having a vehicle such as ethylcellulose and, as the case requires, a solvent, etc. added to a metal powder composed mainly of e.g. silver (Ag) or copper (Cu), may be employed. As the metal powder, e.g. a silver (Ag) powder, a mixed powder of silver and palladium, or a mixed powder of silver and platinum may preferably be employed. Further, in the present invention, in order to sufficiently secure adhesion between a metal layer and an alumina substrate, a conductor paste having a small amount of a glass frit blended may be used.

(d) Step for Forming Reflection Film Paste Layer

A reflection film paste layer 7 containing a material having reflectivity is formed to be a reflection film by screen printing so as to exclude a region having the metal conductor paste layer 2 formed and the vicinity around it, and a region having the wiring conductor paste layer 4 formed and the vicinity around it, of the mounting surface 11 of the main body green sheet 1 provided with the above obtained conductor paste layers. Further, the step for forming a reflective film paste layer may be carried out at the same time as forming the metal conductor paste layer 2 and the wiring conductor paste layer 4 in the above step (c) in such a case where a wiring conductor paste and a reflection film paste are composed of the same paste materials.

The above reflection film paste 7 to be used for screen printing is a paste containing a material having reflectivity to constitute a reflection film. As such a material, as mentioned above, silver, a mixture of silver and palladium, or a mixture of silver and platinum may, for example, be mentioned. However, for the above-mentioned reason, silver is preferably employed. As the reflection film paste 7, it is possible to employ one prepared by adding a vehicle such as ethylcellulose and, as the case requires, a solvent, etc. to a metal powder having such a material as the main component. The film thickness of the reflection film paste layer 7 to be formed is adjusted so that the thickness of the finally obtainable reflection film 7 would be the above-mentioned desired thickness.

(e) Step for Forming Overcoat Glass Paste Layer

On the above mounting surface 11, the overcoat glass paste layer 8 is formed by screen printing so as to cover the entirety of the reflection film paste layer 7 including its edge formed by the above step (d), and to exclude a region having a metal conductor paste layer 2 formed by the above step (c) and the vicinity around it and the wiring conductor paste layer 4 and the vicinity around it.

As the overcoat glass paste, it is possible to employ one having a vehicle such as ethylcellulose and, as the case requires, a solvent, etc. added to a glass powder (glass powder for glass film) to form a paste. The thickness of the overcoat glass paste layer 8 to be formed, is adjusted so that the thickness of the finally obtainable overcoat glass film 8 would be the above-mentioned desired thickness.

The glass powder for the overcoat glass film may be one whereby a film-form glass is obtainable by firing in the step (f) to be carried out after the following step (e), and its 50% particle size ($D_{50}$) is preferably from 0.5 μm to 2 μm. Further, the surface roughness Ra of the overcoat glass film 8 may be adjusted by the particle size of the glass powder for the overcoat glass film. That is, by using, as the glass powder for overcoat glass film, one which can be sufficiently melted during firing and is excellent in fluidity, the surface roughness Ra may be made to be small.

(f) Re-Firing Step

The paste layers formed by the step (c), the step (d) and the step (e) can be re-fired by suitably adjusting the time within a temperature range of from 800° C. to 930° C. If the firing temperature is lower than 800° C., sintering of a metal layer or an overcoat glass film is likely to be insufficient. On the other hand, if it exceeds 930° C., a metal layer or an overcoat layer is likely to soften or flow, and a prescribed shape is impaired, whereby e.g. insufficient wiring or insufficient heat dissipation is likely to occur. In a case where a metal paste containing a metal powder having silver as the main component is employed as the above conductor paste or reflection film paste, the upper limit thereof is preferably 880° C.

(g) Step for Forming Electroconductive Protective Layer

On the fired substrate thus obtained, the first electroconductive protective layer 3 is formed to have a prescribed size and shape, so as to cover the entirety of the above metal conductor layer 2 including its edge, and the second electroconductive protective layer 9 is formed to have a prescribed size and shape, so as to cover the entirety of the above wiring conductor 4 including its edge. Thus, it is possible to obtain a LTCC substrate for mounting light-emitting element to be used for producing the light-emitting device of the present invention.

Now, as a specific method for forming the first electroconductive protective layer 3 and the second electroconductive protective layer 9, a method for forming a Ni/Au-plated layer obtainable by nickel (Ni) plating and then gold (Au) plating, will be described, which is preferred in the light-emitting device of the present invention.

A nickel plate is formed to have a thickness of from 3 to 20 μm by e.g. electrolytic plating employing a nickel sulfamic acid bath. A gold plate can be formed to have a thickness of from 0.1 to 1.0 μm by e.g. electrolytic plating employing a gold potassium cyanide bath.

In the foregoing, the embodiments of the light-emitting device of the present invention have been described with reference to examples, but the light-emitting device of the present invention is not limited thereto. Within the concept of the present invention, and as the case requires, the construction may suitably be changed.

EXAMPLES

Now, Examples of the present invention will be described. However, it should be understood that the present invention is by no means restricted to such Examples.

Example 1

By the following process, a light-emitting device for test, employing a LTCC substrate having the same structure as in FIGS. 1 and 2 was prepared. Here, in the same manner as above, the same symbols are used for the components before and after the firing.

Firstly, a main body green sheet 1 was prepared to prepare the main body LTCC substrate 1 of a substrate for mounting light-emitting element. For the main body green sheet 1, raw materials were blended and mixed so that $SiO_2$ became 60.4 mol %, $B_2O_3$ 15.6 mol %, $Al_2O_3$ 6 mol %, CaO 15 mol %, $K_2O$ 1 mol % and $Na_2O$ 2 mol %, and this raw material mixture was put into a platinum crucible and melted at 1,600° C. for 60 minutes. Then, this molten state glass was cast and cooled. This glass was ground by a ball mill made of alumina for 40 hours to obtain a glass powder for substrate main body. Here, ethyl alcohol was used as the solvent at the time of grinding.

40 mass % of this glass powder for substrate main body and 60 mass % of alumina filler (tradename: AL-45H manufactured by Showa Denko K.K.) were blended and mixed to prepare a glass ceramics composition. To 50 g of this glass ceramics composition, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of polyvinyl butyral (tradename: PVK#3000K manufactured by DENKI KAGAKU KOGYO KABUSHIKI KAISHA) as a binder and a dispersing agent (tradename: BYK180 manufactured by BYK Japan KK) were blended and mixed to prepare a slurry.

This slurry was applied on a PET film by a doctor blade method, and dried to obtain a green sheet, and such green sheets were laminated to prepare a substantially flat plate-form green sheet for main body which has a cavity having a bottom surface constituting a substantially circular mounting surface on the upper surface and which would have a thickness of 0.4 mm at the bottom surface of the cavity after firing.

On the other hand, an electroconductive powder (tradename: S550 manufactured by Daiken Chemical Co., Ltd.) and ethylcellulose as a vehicle were blended in a mass ratio of 85:15 and dispersed in α-terpineol as a solvent so that the solid content would be 85 mass %. Then, kneading was carried out in a porcelain mortar for 1 hour, and further, dispersion was carried out three times by a three roll mill to prepare a metal paste.

To the portions corresponding to the via conductor 6 and the thermal via 10 of the main body green sheet 1, a columnar through-hole having a diameter of 0.3 mm for the via conductor 6 and a square rod shape through-hole of 1.3×1.3 mm for the thermal via 10 were formed by means of a punch, and the metal paste was filled by a screen printing method to form a non-fired via conductor paste layer 6 and a non-fired thermal via 10.

A metal conductor paste layer 2 was formed on the mounting portion 12 of the main body green sheet 1, the wiring conductor paste layer 4 was formed on the mounting surface 11, and an external electrode terminal conductor paste layer 5 and a heat dissipation conductor paste layer 15 were formed on the non-mounting surface 13, to obtain the green sheet main body 1 provided with conductor paste layers.

A silver paste for reflection film layer 7 was formed to have a thickness of 10 μm after firing, by screen printing so as to exclude a region having the metal conductor paste layer 2 formed and the vicinity around it, and a region having the wiring conductor paste layer 4 formed and the vicinity around it, on the mounting surface 11 in the main body green sheet 1 provided with conductor paste layers. On the paste layer 7, an overcoat glass paste layer 8 was formed by screen printing to have a film thickness of 20 μm after the firing, so as to cover the entirety of the above silver paste for reflection film layer 7 including its edge and to exclude a region having the above metal conductor paste layer 2 formed and the vicinity around it and a region having the wiring conductor paste layer 4 formed and the vicinity around it, whereby a non-fired substrate for mounting a light-emitting element was prepared.

Here, the above silver paste for reflection film was prepared by blending a silver powder (tradename: S400-2 manufactured by Daiken Chemical Co., Ltd.) and ethylcellulose as a vehicle in a mass ratio of 90:10, then dispersing the mixture in α-terpineol as a solvent so that the solid content would be 87 mass %, followed by kneading in a porcelain mortar for 1 hour, and further by dispersion three times by a three roll mill. Further, the glass powder for glass film used for the preparation of the above overcoat glass paste was prepared as follows. Firstly, raw materials were blended and mixed so that $SiO_2$ became 81.6 mol %, $B_2O_3$ 16.6 mol % and $K_2O$ 1.8 mol %, and this raw material mixture was put into a platinum crucible and melted at 1,600° C. for 60 minutes. Then, this molten state glass was cast and cooled. This glass was ground by a ball mill made of alumina for from 8 to 60 hours to obtain the glass powder for glass film 60 mass % of this glass powder for overcoat glass film and 40 mass % of a resin component (one containing ethylcellulose and α-terpineol in a mass ratio of 85:15) were blended and then kneaded in a porcelain mortar for 1 hour and further dispersed three times by a three roll mill to prepare an overcoat glass paste.

The non-fired substrate for mounting light-emitting element obtained above was subjected to binder burn out by holding it at 550° C. for 5 hours, and further, firing was carried out by holding it at 870° C. for 30 minutes. A Ni/Au-plated layer 3 (1.315 mm×1.315 mm) and a Ni/Au-plated layer 9 being in contact with the edge of the overcoat glass film 8 were formed so as to cover the entirety of the metal conductor layer 2 including its edge and to cover the entirety of the wiring conductor 4 including its edge, on the mounting surface 11 of the fired substrate for mounting a light-emitting element obtained. Here, the Ni/Au-plated layer was formed in such a manner that a Ni-plated film having a thickness of 7 μm was formed by electrolytic plating using a nickel sulfamic acid bath, and on the surface thereof, an Au-plated film having a thickness of 0.3 μm was formed by electrolytic plating using a gold potassium cyanide bath.

On the above prepared metal conductor layer 2/Ni/Au-plated layer 3 on the mounting portion 12 of the substrate for mounting light-emitting element, the light-emitting diode element 30 (tradename: ES-CEBLV45:1.14 mm×1.14 mm, manufactured by EPISTAR Corporation) was fixed by a Au 20 wt %-Sn 80 wt % solder so that the surface of the metal film 32 faced below. At that time, the width (represented by w in FIGS. 1 and 2) of the non-mounting region 14 having no light-emitting diode element 30 mounted on the Ni/Au-plated layer 3, was 87.5 μm at each of four edges. Then, a pair of electrodes (not shown) provided on the light-emitting diode element 30 were electrically connected to the Ni/Au-plated layers 9 on the wiring conductors 4 respectively, by bonding wires 22.

Further, using a sealing agent (tradename: SCR-1016A manufactured by Shin-Etsu Chemical Co., Ltd.), sealing was carried out to form a sealing layer 23 as shown in FIG. 2, whereby the light-emitting device 20 was obtained. As the sealing agent, one containing a phosphor (tradename: P46-Y3 manufactured by Mitsubishi Chemical Holdings Corporation) in an amount of 20 mass % based on the sealing agent, was used.

Example 2

A light-emitting device was prepared in the same manner as in Example 1 except that by using the same glass powder as in Example 1, 38 mass % of this glass powder, 38 mass % of alumina filler (tradename: AL-45H manufactured by Showa Denko K.K.) and 24 mass % of zirconia filler (tradename: HSY-3F-J manufactured by Daiichi Kigenso Kagaku Kogyo Co., Ltd.) were blended and mixture to prepare a glass ceramics composition.

Comparative Example

A light-emitting device of a conventional structure was prepared as Comparative Example in the same manner as in Example 1 except that in the above Example 1, the light-emitting diode element was fixed by using a silicone die bond material (tradename: KER-3000-M2 manufactured by Shin-Etsu Chemical Co., Ltd.) instead of the Au 20 wt %-Sn 80 wt % solder.

<Evaluation>

With respect to the light-emitting devices obtained in the above Examples 1 and 2 and Comparative Example, the total luminous flux and the thermal resistance were measured by the below-mentioned methods.

[Total Luminous Flux]

The measurement of the total luminous flux of the light-emitting device was carried out by using a LED total luminous flux-measuring device (tradename: SOLIDLAMBDA-CCD-LED-MONITOR-PLUS manufactured by Spectra Co-op). The integrating sphere was 6 inches, and as a voltage/current generator, R6243 manufactured ADVANTEST Corporation was used. Further, the measurement was carried out by applying 35 mA to the LED element.

[Thermal Resistance]

The thermal resistance of the substrate for mounting light-emitting element in the light-emitting device was measured by using a thermal resistance-measuring device (tradename: TH-2167 manufactured by MINEKOONDENKI). Here, the applied electric current was 35 mA, and the current was applied until the voltage drop was saturated, whereupon the saturation temperature was calculated by the temperature coefficient led from the dropped voltage and the temperature-voltage drop properties of the light-emitting diode element, and the thermal resistance was obtained.

The results are shown in Table 1. Here, the results are shown by percentages when the total luminous flux and the thermal resistance in the conventional light-emitting device of Comparative Example were regarded as 100%.

TABLE 1

| | Total luminous flux (%) | Thermal resistance (%) |
|---|---|---|
| Comparative Example 1 | 100 | 100 |
| Example 1 | 95 | 50 |
| Example 2 | 105 | 50 |

As compared with a conventional light-emitting device in which a light-emitting element having a metal film is fixed by a silicone die bond material, the light-emitting device of the present invention obtained in Example 1 shows equally a high level in total luminous flux, and further shows a half value in thermal resistance, and thus it is evident that the heat dissipation property is excellent. Further, in the light-emitting device of Example 1, the entire surface of the silver reflection film is covered with an overcoat glass film, whereby the light-emitting device has such a structure that the deterioration of the silver reflection film with time is prevented and the deterioration of the light extraction efficiency due to long-term use is suppressed. In addition, it is found that the light-emitting device of the present invention obtained in Example 2 can also obtain the same effect as Example 1, and further the total luminous flux is also excellent by using a glass ceramics composition having high reflectance.

INDUSTRIAL APPLICABILITY

According to the present invention, it is possible to provide a light-emitting device mounting a light-emitting element having a reflective metal film on the surface on the side opposite to a light emitting layer, which is excellent in the light extraction efficiency since it has high heat dissipation property and high light reflection efficiency, and which can suppress the deterioration of light extraction efficiency due to the deterioration with time. Such a light-emitting device is useful as a backlight for e.g. mobile phones or liquid crystal displays, as illumination for automobiles or decorations, or as other light sources.

MEANING OF SYMBOLS

1: substrate main body, 2: metal conductor layer, 3: first electroconductive protective layer (for protecting metal conductor layer), 4: wiring conductor, 5: external electrode terminal, 6: via conductor, 7: reflection film, 8: insulating protective layer, 9: second electroconductive protective layer (for protecting wiring conductor), 10: thermal via, 11: mounting surface, 12: mounting portion, 13: non-mounting surface, 14: non-mounting region, 15: heat dissipation conductor, 20: light-emitting device, 21: electroconductive bonding material, 22: bonding wire, 23: sealing layer, 30: light-emitting element, 31: light emitting layer, 32: metal film The entire disclosures of Japanese Patent Application No. 2010-056231 filed on Mar. 12, 2010 and Japanese Patent Application No. 2010-231623 filed on Oct. 14, 2010 including specifications, claims, drawings and summaries are incorporated herein by reference in their entireties.

What is claimed is:

1. A light-emitting device which comprises:
a substrate made of an inorganic insulating material and having a mounting surface a part of which constitutes a mounting portion on which a light-emitting element is to be mounted,
a metal conductor layer formed on the mounting portion of the substrate,
a first electroconductive protective layer formed on the metal conductor layer so as to cover the entirety including its edge and to have an area larger than a metal film of the light-emitting element,
the light-emitting element having a light emitting layer on the main surface and a reflective metal film on the surface on the side opposite to the main surface, and mounted on the mounting portion of the substrate so that the metal film faces the first electroconductive protective layer and is located inside the edge of the first electroconductive protective layer,
an electroconductive bonding material to bond the metal film of the light-emitting element with the first electroconductive protective layer,
a reflection film formed on the mounting surface of the substrate in such a shape as to exclude at least the first electroconductive protective layer formed on the metal conductive layer and the vicinity around it, and
an insulating protective layer formed on the mounting surface of the substrate so as to cover the entirety of the reflection film including its edge.

2. The light-emitting device according to claim 1, wherein the substrate is made of a sintered product of a glass ceramics composition comprising a glass powder and a ceramics filler.

3. The light-emitting device according to claim 2, which has a thermal via which is disposed just under the mounting portion to extend from the mounting surface of the substrate to a non-mounting surface as a surface opposite to the mounting surface, so as to be embedded in the substrate.

4. The light-emitting device according to claim 3, wherein the reflection film is made of silver, and further the insulating protective layer is made of glass.

5. The light-emitting device according to claim 2, wherein the reflection film is made of silver, and further the insulating protective layer is made of glass.

6. The light-emitting device according to claim 1, which has a thermal via which is disposed just under the mounting portion to extend from the mounting surface of the substrate to a non-mounting surface as a surface opposite to the mounting surface, so as to be embedded in the substrate.

7. The light-emitting device according to claim 6, wherein the reflection film is made of silver, and further the insulating protective layer is made of glass.

8. The light-emitting device according to claim 1, wherein the first electroconductive protective layer has a non-mounting region having a width of from 70 to 200 μm around a region where the light-emitting element is bonded.

9. The light-emitting device according to claim 1, which has a wiring conductor formed on the mounting surface of the substrate, wherein the wiring conductor and the light-emitting element are electrically connected by a bonding wire, and the reflection film is formed on the mounting surface of the substrate so as to exclude the first electroconductive protective layer formed on the metal conductive layer and the vicinity around it, and the wiring conductor and the vicinity around it.

10. The light-emitting device according to claim 9, which further has a second electroconductive protective layer formed on the wiring conductor so as to cover the entirety including its edge.

11. The light-emitting device according to claim 1, wherein the first electroconductive protective layer and the second electroconductive protective layer are gold-plated layers.

12. The light-emitting device according to claim 1, wherein the reflection film is made of silver, and further the insulating protective layer is made of glass.

* * * * *